(12) United States Patent
Seo et al.

(10) Patent No.: US 10,164,645 B2
(45) Date of Patent: Dec. 25, 2018

(54) SEMICONDUCTOR DEVICE INCLUDING DLL AND SEMICONDUCTOR SYSTEM

(71) Applicant: SK hynix Inc., Gyeonggi-do (KR)

(72) Inventors: Young-Suk Seo, Seoul (KR); Da-In Im, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/624,977

(22) Filed: Jun. 16, 2017

(65) Prior Publication Data

US 2018/0159543 A1   Jun. 7, 2018

(30) Foreign Application Priority Data

Dec. 1, 2016 (KR) .................. 10-2016-0162476

(51) Int. Cl.

| | |
|---|---|
| *H03L 7/081* | (2006.01) |
| *G11C 11/407* | (2006.01) |
| *H03H 11/26* | (2006.01) |
| *G06F 1/10* | (2006.01) |
| *G11C 7/22* | (2006.01) |
| *H01Q 3/26* | (2006.01) |
| *G11C 8/18* | (2006.01) |
| *G11C 7/10* | (2006.01) |
| *G11C 11/4076* | (2006.01) |
| *G11C 29/02* | (2006.01) |
| *G11C 11/4093* | (2006.01) |

(52) U.S. Cl.
CPC .............. *H03L 7/0814* (2013.01); *G06F 1/10* (2013.01); *G11C 7/1093* (2013.01); *G11C 7/222* (2013.01); *G11C 8/18* (2013.01); *G11C 11/407* (2013.01); *G11C 11/4076* (2013.01); *H01Q 3/26* (2013.01); *H03H 11/265* (2013.01); *H03L 7/081* (2013.01); *G11C 11/4093* (2013.01); *G11C 29/023* (2013.01); *G11C 29/028* (2013.01); *G11C 2207/2272* (2013.01)

(58) Field of Classification Search
CPC ........ H03L 7/081; H03L 7/0814; G11C 7/222
See application file for complete search history.

(56) References Cited

U.S. PATENT DOCUMENTS

| | | | |
|---|---|---|---|
| 6,512,470 B2 | 1/2003 | Fwu | |
| 2006/0038597 A1* | 2/2006 | Becker | G11C 7/22 327/158 |
| 2010/0208534 A1* | 8/2010 | Fujisawa | G11C 5/04 365/193 |
| 2010/0257398 A1* | 10/2010 | Alexander | G11C 7/1045 713/500 |

(Continued)

FOREIGN PATENT DOCUMENTS

KR   1020110138507   12/2011

*Primary Examiner* — Thomas J. Hiltunen
(74) *Attorney, Agent, or Firm* — IP & T Group LLP

(57) ABSTRACT

A semiconductor system includes: a controller suitable for outputting an external clock signal and a command/address signal; and a semiconductor device suitable for selecting one of pre-stored code values of a delay control signal to output an initial value control signal according to the command/address signal, and outputting an internal clock signal by delaying the external clock signal by a predetermined time based on the delay control signal having an initial value that is set in response to the initial value control signal.

15 Claims, 8 Drawing Sheets

(56) References Cited

U.S. PATENT DOCUMENTS

| | | | |
|---|---|---|---|
| 2011/0227619 A1* | 9/2011 | Kitagawa | G11C 7/222 |
| | | | 327/158 |
| 2012/0154001 A1* | 6/2012 | Seo | H03L 7/0814 |
| | | | 327/158 |
| 2013/0009683 A1* | 1/2013 | Ichida | G11C 7/222 |
| | | | 327/158 |
| 2013/0028038 A1* | 1/2013 | Fujisawa | G11C 7/222 |
| | | | 365/222 |
| 2014/0204697 A1* | 7/2014 | Kim | G11C 7/1066 |
| | | | 365/233.12 |
| 2015/0213873 A1* | 7/2015 | Joo | H03L 7/087 |
| | | | 365/154 |
| 2015/0256187 A1* | 9/2015 | Hwang | H03L 7/0802 |
| | | | 365/194 |
| 2017/0237444 A1* | 8/2017 | Wei | H03L 7/0814 |
| | | | 327/156 |

* cited by examiner

SEMICONDUCTOR DEVICE INCLUDING DLL AND SEMICONDUCTOR SYSTEM

CROSS-REFERENCE TO RELATED APPLICATIONS

The present application claims priority to Korean Patent Application No. 10-2016-0162476, filed on Dec. 1, 2016, which is herein incorporated by reference in its entirety.

BACKGROUND

1. Field

Exemplary embodiments of the present invention relate to a semiconductor designing technology, and more particularly, to a semiconductor device including a Delay Locked Loop (DLL) and a semiconductor system including the semiconductor device.

2. Description of the Related Art

A clock is generally used as a reference for tuning timing for an operation in a system or a circuit. Also, a clock may be used to secure a fast operation being performed without an error. When an external clock is inputted from an external device and used in an internal circuit, time delay (which is called 'skew') is caused by the internal circuit. Herein, a Delay Locked Loop (DLL) is used to compensate for the time delay and make an internal clock have the same phase as the external clock.

Meanwhile, the delay locked loop has an advantage in that it is less affected by noise than a phase locked loop (PLL), which has been used conventionally. For this reason, the delay locked loop is widely used for synchronous semiconductor memories, such as a Synchronous Dynamic Random Access Memory (SDRAM) and a Double Data Rate SDRAM (DDR SDRAM).

The delay locked loop may operate to compensate for a delay time difference between an external clock, i.e., a reference clock signal, and a feedback clock signal obtained as the reference clock signal passes through a replica.

However, as a frequency of the reference clock signal increases, a locking time of the delay locked loop, which is the time taken until a rising edge of the feedback clock signal and a rising edge of the reference clock signal coincides with each other, becomes considerably long. As a result, the delay locked loop does not obtain sufficient timing margin and accordingly, an operation stability of a system including a semiconductor memory device provided with the delay locked loop is deteriorated.

SUMMARY

Embodiments of the present invention are directed to a semiconductor device including a Delay Locked Loop (DLL) capable of increasing an operation timing margin by setting an optimal value of a delay control signal within a short time, and a semiconductor system including the semiconductor device.

In accordance with an embodiment of the present invention, a semiconductor system includes: a controller suitable for outputting an external clock signal and a command/address signal; and a semiconductor device suitable for selecting one of pre-stored code values of a delay control signal to output an initial value control signal according to the command/address signal, and outputting an internal clock signal by delaying the external clock signal by a predetermined time based on the delay control signal having an initial value that is set in response to the initial value control signal.

In accordance with another embodiment of the present invention, a semiconductor device includes: a decoding unit suitable for decoding a command/address signal and generating an input control signal and an output control signal; an initial value setting unit suitable for including a plurality of storages corresponding to bits of the input control signal, sequentially storing code values of a delay control signal in the storages in response to the input control signal when a locking signal is enabled, and selecting one of the stored code values to output an initial value control signal based on the output control signal; and a delay locked loop (DLL) suitable for generating the delay control signal having an initial value that is set based on the initial value control signal, performing a locking operation of generating an internal clock signal by delaying an external clock signal based on the delay control signal, and outputting the locking signal and the delay control signal when the locking operation is finished.

In accordance with yet another embodiment of the present invention, a semiconductor system includes: a controller suitable for outputting an external clock signal, and selecting one of pre-stored code values of a delay control signal to output the selected code value as an initial value control signal based on frequency information on the external clock signal; and a semiconductor device suitable for generating the delay control signal having an initial value that is set based on the initial value control signal, and outputting an internal clock signal by delaying the external clock signal by a predetermined time based on the delay control signal.

DETAILED DESCRIPTION

Figure 1:
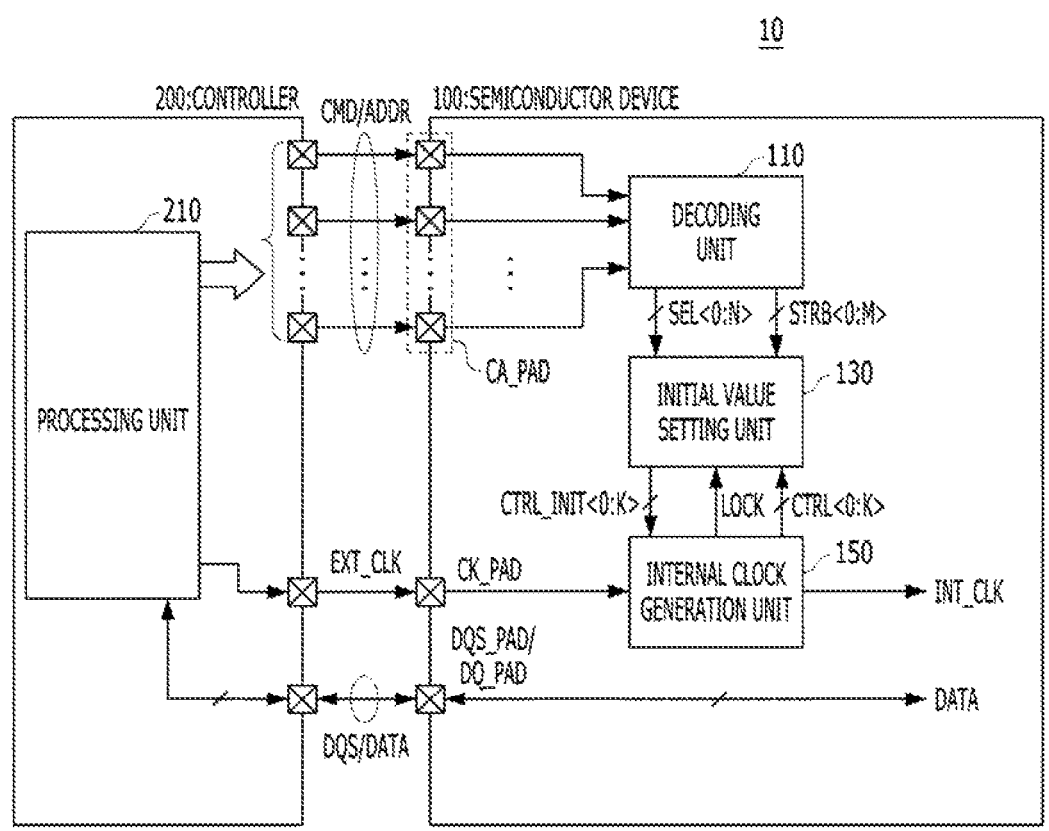
FIG. 1 is a block diagram illustrating a semiconductor system in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that the drawings are simplified schematics and as such are not necessarily drawn to scale. In some instances, various parts of the drawings may have been exaggerated in order to more clearly illustrate certain features of the illustrated embodiments.

It is further noted that in the following description, specific details are set forth for facilitating the understanding of the present invention, however, the present invention may be practiced without some of these specific details.

Also, it is noted, that well-known structures and/or processes may have only been described briefly or not described at all to avoid obscuring the present disclosure with unnecessary well known details.

It is also noted, that in some instances, as would be apparent to those skilled in the relevant art, an element (also referred to as a feature) described in connection with one embodiment may be used singly or in combination with other elements of another embodiment, unless specifically indicated otherwise.

FIG. 1 is a block diagram illustrating a semiconductor system 10 in accordance with an embodiment of the present invention.

Referring to FIG. 1, the semiconductor system 10 may include a semiconductor device 100 and a controller 200.

The controller 200 may output an external clock signal EXT_CLK and a command/address signal CMD/ADDR to the semiconductor device 100. According to an embodiment of the present invention, the controller 200 may generate the command/address signal CMD/ADDR including frequency information on the external clock signal EXT_CLK.

The semiconductor device 100 may select a pre-stored code value of a delay control signal CTRL<0:K> to output the selected code value as an initial value control signal CTRL_INIT<0:K>, according to the command/address signal CMD/ADDR which is inputted from the controller 200, and may output an internal clock signal INT_CLK by delaying the external clock signal EXT_CLK by a predetermined time based on the delay control signal CTRL<0:K> having an initial value which is set according to the initial value control signal CTRL_INIT<0:K>. According to an embodiment of the present invention, the semiconductor device 100 may be a semiconductor memory device. Particularly, the semiconductor device 100 may be a Dynamic Random Access Memory (DRAM).

The controller 200 may transfer the external clock signal EXT_CLK and the command/address signal CMD/ADDR to the semiconductor device 100 along with data DATA during a write operation. A data strobe signal DQS may be transferred to the semiconductor device 100 along with the data DATA.

The controller 200 may transfer the external clock signal EXT_CLK and the command/address signal CMD/ADDR to the semiconductor device 100 during a read operation, and the semiconductor device 100 may read the data DATA that is stored internally and transfer the read data DATA to the controller 200 along with the data strobe signal DQS. An internal circuit (not shown) of the semiconductor device 100 may receive the internal clock signal INT_CLK, the command/address signal CMD/ADDR, and the data DATA and perform the read operation or the write operation. Since the read operation or the write operation described above is not related to the point of the present invention, detailed description on them is omitted herein.

The controller 200 may include a processing unit 210 for generating the external clock signal EXT_CLK, the command/address signal CMD/ADDR, and the data DATA. The processing unit 210 may generate the command/address signal CMD/ADDR including frequency information on the external clock signal EXT_CLK.

The semiconductor device 100 may include a decoding unit 110, an initial value setting unit 130, and an internal clock generation unit 150.

The decoding unit 110 may generate an input control signal STRB<0:M> and an output control signal SEL<0:N> by decoding the command/address signal CMD/ADDR.

The initial value setting unit 130 may include a plurality of storages (not shown) respectively corresponding to bits of the input control signal STRB<0:M>. Whenever a locking signal LOCK is enabled, the initial value setting unit 130 may sequentially store the code values of the delay control signal CTRL<0:K> in the storages corresponding to the input control signal STRB<0:M>, and select one of the pre-stored code values to output the initial value control signal CTRL_INIT<0:K> in response to the output control signal SEL<0:N>.

The internal clock generation unit 150 may generate the delay control signal CTRL<0:K> having an initial value that is set based on the initial value control signal CTRL_INIT<0:K>, perform a locking operation of generating the internal clock signal INT_CLK by delaying the external clock signal EXT_CLK based on the delay control signal CTRL<0:K>, and output the locking signal LOCK and the delay control signal CTRL<0:K> when the locking operation is finished. According to the embodiment of the present invention, the internal clock generation unit 150 may be formed of a delay locked loop (DLL), for example, a digital delay locked loop. Herein, the locking signal LOCK of the delay locked loop DLL is a signal that is enabled when the frequency and phase of a feedback clock signal FB_CLK that is internally generated coincide with the frequency and phase of the external clock signal EXT_CLK, that is, when a locking operation of the delay locked loop DLL is finished.

Meanwhile, the semiconductor device 100 may further include a clock pad CK_PAD for receiving the external clock signal EXT_CLK, a command/address pad CA_PAD for receiving the command/address signal CMD/ADDR, and a data pad DQ_PAD and a data strobe pad DQS_PAD for receiving/outputting the data DATA and the data strobe signal DQS, respectively. Although it is illustrated in FIG. 1 that there is one data pad DQ_PAD, more data pads DQ_PAD may be provided to equal the number of input/output data burst bits. Also, although not illustrated in the drawing, an input buffer for buffering signals that are inputted through the above-mentioned pads and output drivers for driving signals that are outputted through the pads may be additionally included.

Hereafter, exemplary configurations of the constituent elements of the semiconductor device of FIG. 1 are described in detail with reference to the accompanying drawings.

Figure 2:
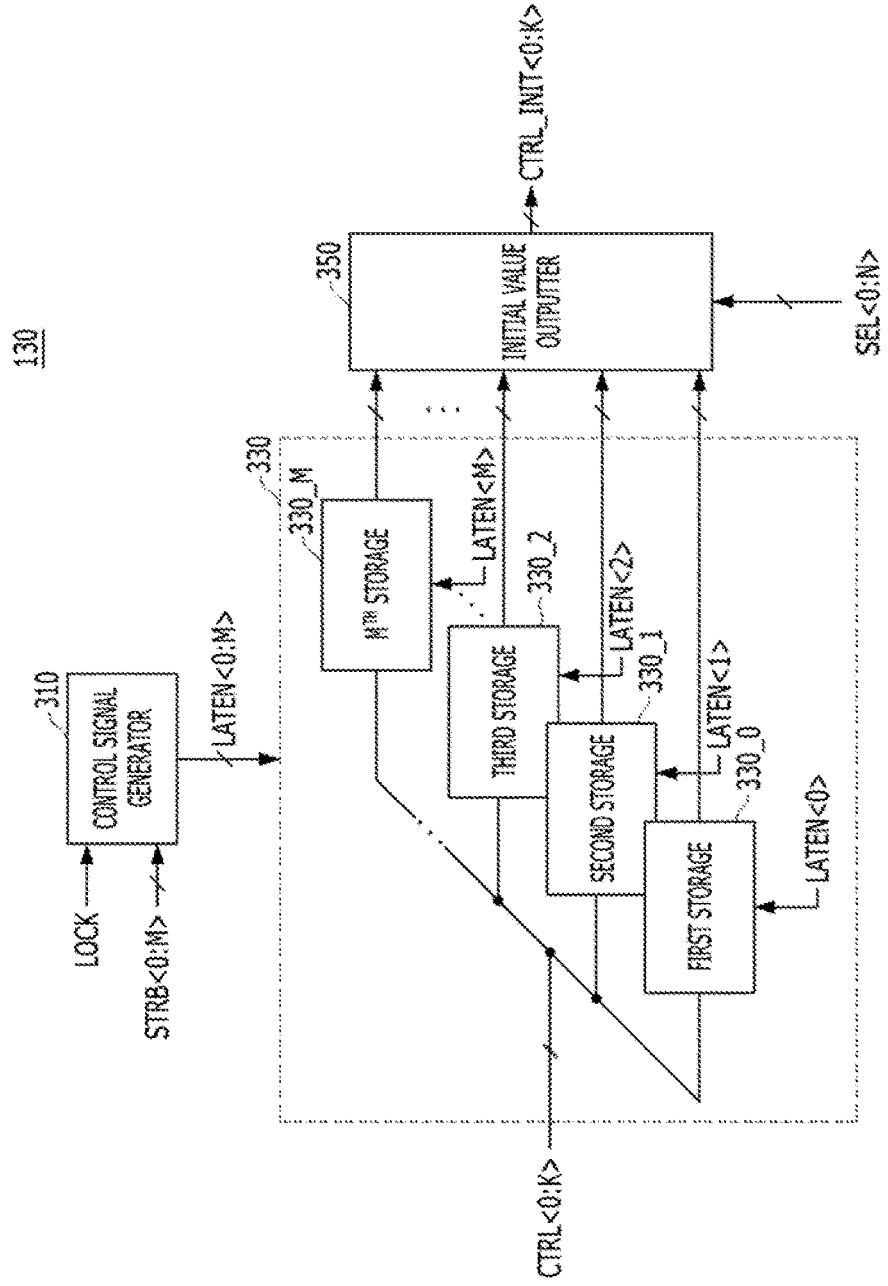
FIG. 2 is a block diagram illustrating an initial value setting unit of a semiconductor device shown in FIG. 1.

FIG. 2 is a block diagram illustrating the initial value setting unit 130 of the semiconductor device shown in FIG. 1.

Referring to FIG. 2, the initial value setting unit 130 may include a control signal generator 310, a preceding value storage 330, and an initial value outputter 350.

The control signal generator 310 may generate a latch control signal LATEN<0:M> according to the input control signal STRB<0:M> whenever the locking signal LOCK received from the internal clock generation unit 150 is enabled.

The preceding value storage 330 may include a plurality of storages 330_0 to 330_M that correspond to each bit of the latch control signal LATEN<0:M>, respectively. The preceding value storage 330 may sequentially store the delay control signal CTRL<0:K> outputted from the internal clock generation unit 150 (see FIG. 1) in the storages 330_0 to 330_M in response to each bit of the latch control signal LATEN<0:M>.

The initial value outputter 350 may select one output of the storages 330_0 to 330_M to output the initial value control signal CTRL_INIT<0:K> in response to the output control signal SEL<0:N>.

Figure 3A:
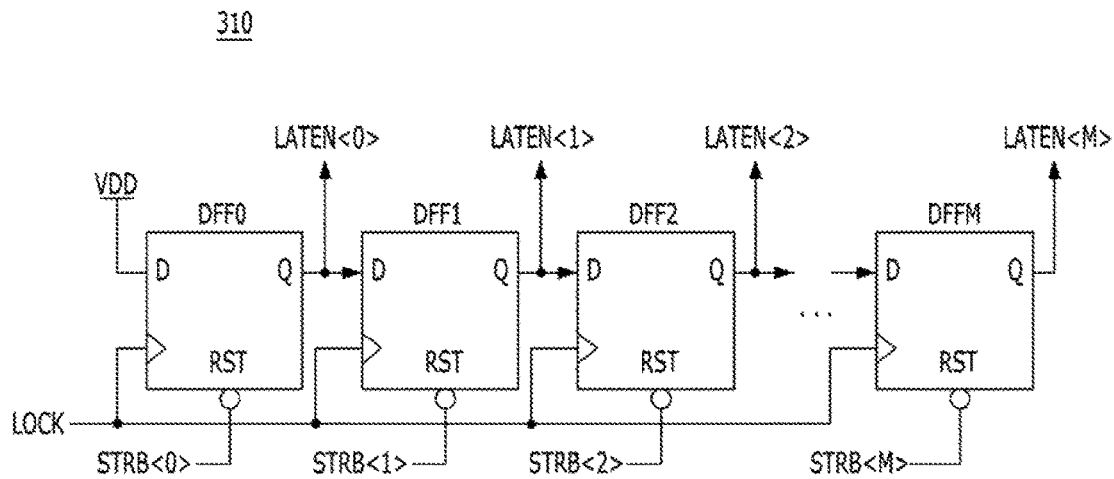
FIG. 3A is a detailed circuit diagram illustrating a control signal generator shown in FIG. 2.
Figure 3B:
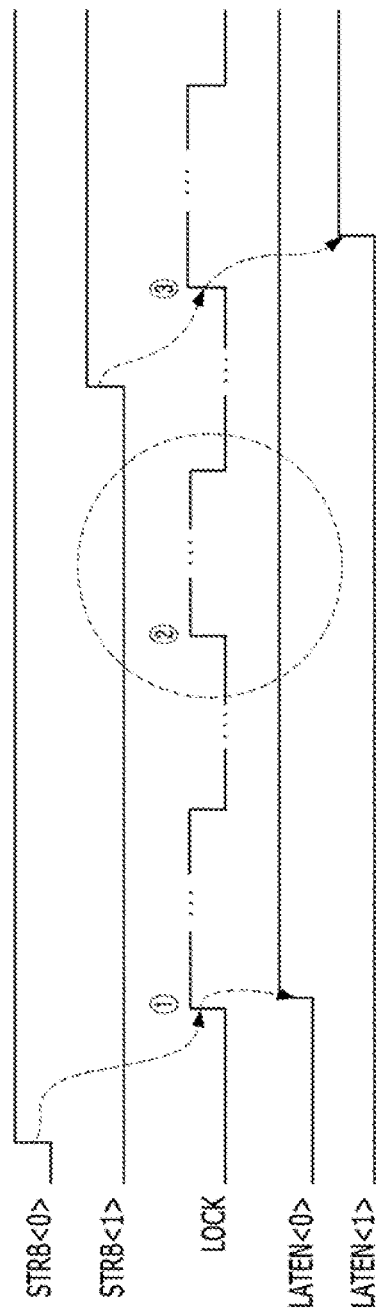
FIG. 3B is a timing diagram illustrating an operation of the control signal generator shown in FIG. 2.

FIG. 3A is a detailed circuit diagram illustrating n exemplary configuration of the control signal generator 310 shown in FIG. 2. FIG. 3B is a timing diagram illustrating an operation of the control signal generator 310 shown in FIG. 2.

Referring to FIG. 3A, the control signal generator 310 may include a plurality of flip-flops DFF0 to DFFM that are coupled in series. According to an embodiment of the present invention, the flip-flops DFF0 to DFFM may be D-flip-flops. An input terminal D of the foremost flip-flop DFF0 among the flip-flops DFF0 to DFFM may be coupled to a power source voltage (VDD) terminal. Each of the flip-flops DFF0 to DFFM may receive the locking signal LOCK through a clock terminal, receive a corresponding bit of the input control signal STRB<0:M> through a reset terminal RST, and receive an output of the preceding flip-flop through the input terminal D. A corresponding bit of the latch control signal LATEN<0:M> may be outputted through an output terminal Q of each of the flip-flops DFF0 to DFFM. The number of the flip-flops DFF0 to DFFM may correspond to the number of the bits of the latch control signal LATEN<0:M>.

Each of the flip-flops DFF0 to DFFM may output its output signal from its output terminal Q to the input terminal D of the next flip-flop when the locking signal LOCK is enabled while the corresponding bit of the input control signal STRB<0:M> is enabled. Therefore, when the bits of the input control signal STRB<0:M> are sequentially enabled, the flip-flops DFF0 to DFFM may sequentially enable first to $(M+1)^{th}$ bits of the latch control signal LATEN<0:M>, whenever the locking signal LOCK is enabled.

Referring to FIG. 3B, the control signal generator 310 may generate the latch control signal LATEN<0:M> corresponding to each bit of the input control signal STRB<0:M>, whenever the locking signal LOCK is enabled.

For example, while a first bit STRB<0> of the input control signal STRB<0:M> is enabled, a first bit LATEN<0> of the latch control signal LATEN<0:M> may be enabled when the locking signal LOCK is enabled (①). While a second bit STRB<1> of the input control signal STRB<0:M> is enabled, a second bit LATEN<1> of the latch control signal LATEN<0:M> may be enabled when the locking signal LOCK is enabled (③). We note, that although the locking signal LOCK is enabled (②), since the second bit STRB<1> of the input control signal STRB<0:M> is disabled, the second bit LATEN<1> of the latch control signal LATEN<0:M> is not enabled.

As described above, the initial value setting unit 130 may pre-store the code values of the delay control signal CTRL<0:K> for each frequency of the external clock signal EXT_CLK. For example, the initial value setting unit 130 may selectively store only the code values of the delay control signal CTRL<0:K> corresponding to a desired frequency by using the input control signal STRB<0:M>. Further, the initial value setting unit 130 may set a code value corresponding to a frequency of a current external clock EXT_CLK from the pre-stored code values, as the initial value of the delay control signal CTRL<0:K> by using the output control signal SEL<0:N>.

Figure 4:
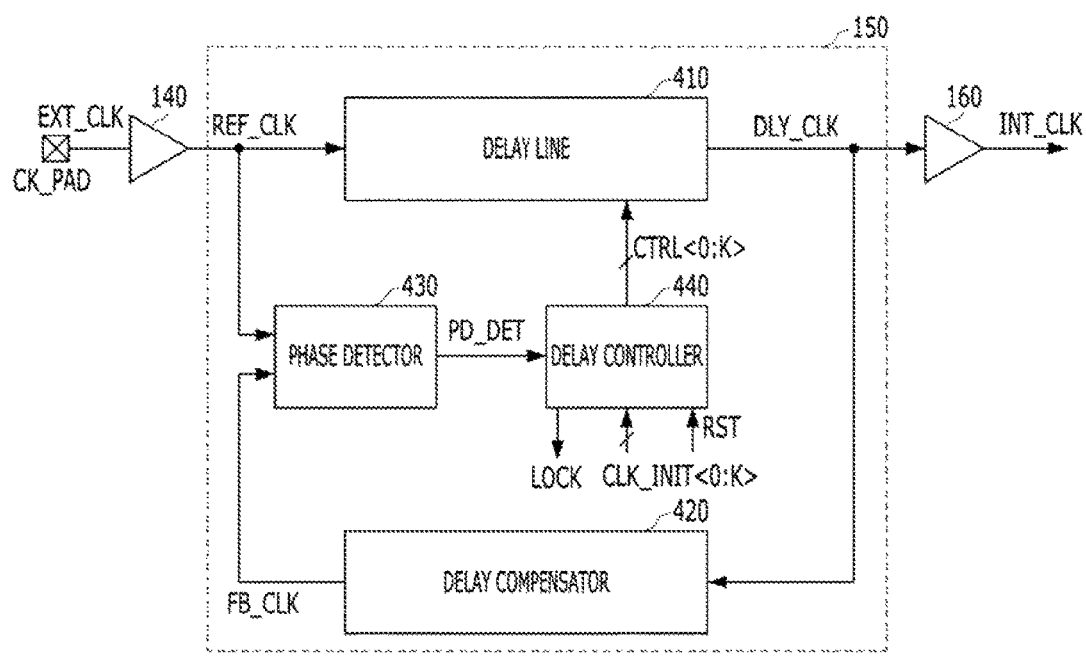
FIG. 4 is a detailed block diagram illustrating an internal clock generation unit shown in FIG. 1.

FIG. 4 is a detailed block diagram illustrating an exemplary configuration of the internal clock generation unit 150 shown in FIG. 1.

Referring to FIG. 4, in addition to the internal clock generation unit 150 shown in FIG. 1, an input buffer 140 and an output driver 160 are shown together. The input buffer 140 may generate a reference clock signal REF_CLK by buffering the external clock signal EXT_CLK inputted through the clock pad CK_PAD. The output driver 160 may drive a delay clock signal DLY_CLK outputted through the internal clock generation unit 150 and finally output the internal clock signal INT_CLK.

The internal clock generation unit 150 may include a delay line 410, a delay compensator 420, a phase detector 430, and a delay controller 440.

The delay line 410 may generate the delay clock signal DLY_CLK by delaying the reference clock signal REF_CLK in response to the delay control signal CTRL<0:K> received from the delay controller 440. The delay compensator 420 may generate a feedback clock signal FB_CLK by delaying the delay clock signal DLY_CLK received from the delay line 410 by a predetermined time. The phase detector 430 may generate a phase detecting signal PD_DET by comparing a phase of the reference clock signal REF_CLK received from the input buffer 140 with a phase of the feedback clock signal FB_CLK received from the delay compensator 420.

The delay controller 440 may generate the delay control signal CTRL<0:K> based on the phase detecting signal PD_DET received from the phase detector. For example, the delay controller 440 may generate the delay control signal CTRL<0:K> to have an initial value that is set based on the initial value control signal CTRL_INIT<0:K>. The delay controller 440 may output the locking signal LOCK and the delay control signal CTRL<0:K>, when the frequency and phase of the reference clock signal REF_CLK coincide with the frequency and phase of the feedback clock signal FB_CLK and a desired internal clock signal INT_CLK is outputted, that is, when the locking operation is finished. Meanwhile, the delay controller 440 may receive a reset signal RST, and initialize the locking signal LOCK and the delay control signal CTRL<0:K> in response to the reset signal RST after the locking operation is finished.

As described above, the internal clock generation unit 150 may generate the delay control signal CTRL<0:K> to have the set initial value based on the initial value control signal CTRL_INIT<0:K>, delay the reference clock signal REF_CLK to generate the delay clock signal DLY_CLK by using the delay control signal CTRL<0:K>. Therefore, the internal clock generation unit 150 may increase a clock generation speed, and reduce a locking time of the internal clock generation unit 150.

Figure 5:
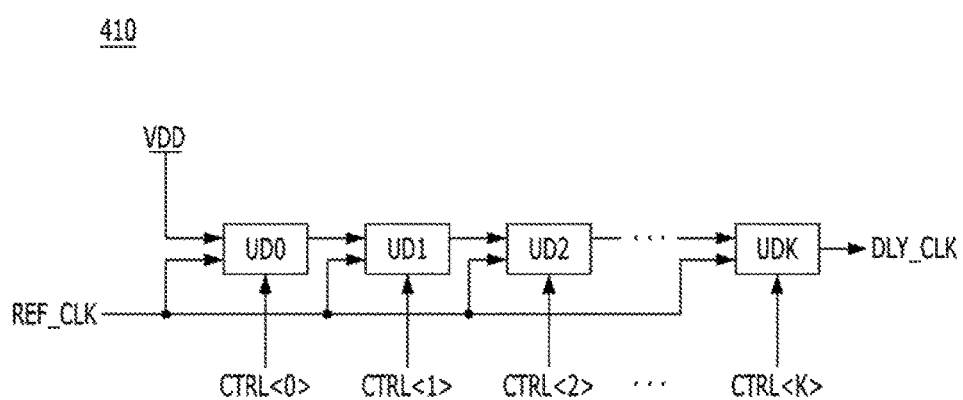
FIG. 5 is a detailed circuit diagram illustrating a delay line shown in FIG. 4.

FIG. 5 is a detailed circuit diagram illustrating an exemplary configuration of the delay line 410 shown in FIG. 4.

Referring to FIG. 5, the delay line 410 may include a plurality of unit delayers UD0 to UDK that are coupled in series.

The unit delayers UD0 to UDK may delay the reference clock signal REF_CLK based on the delay control signal CTRL<0:K> received from the delay controller 440, which is formed of a plurality of bits, and finally generate the delay clock signal DLY_CLK.

The foremost unit delayer UD0 among the unit delayers UD0 to UDK may receive one of a power source voltage VDD and the reference clock signal REF_CLK, and the other unit delayers UD1 to UDK may receive one of an output of the preceding unit delayer and the reference clock signal REF_CLK. When a corresponding bit of the delay control signal CTRL<0:K> is enabled, one of the unit delayers UD0 to UDK corresponding to the enabled bit may receive the reference clock signal REF_CLK. For example, when a third bit CTRL<2> of the delay control signal CTRL<0:K> is enabled, the third unit delayer UD2 may receive the reference clock signal REF_CLK instead of the output of the preceding unit delayer, and the third to $K^{th}$ unit delayers UD2 to UDK may sequentially delay the reference clock signal REF_CLK.

As described above, the delay line 410 may decide the positions of the unit delayers UD0 to UDK which receive the reference clock signal REF_CLK based on the code value of the delay control signal CTRL<0:K>, and decide the number of the unit delayers UD0 to UDK through which the reference clock signal REF_CLK passes.

Hereafter, an operation of the semiconductor system in accordance with an embodiment of the present invention is described with reference to FIGS. 1 to 6.

Figure 6:
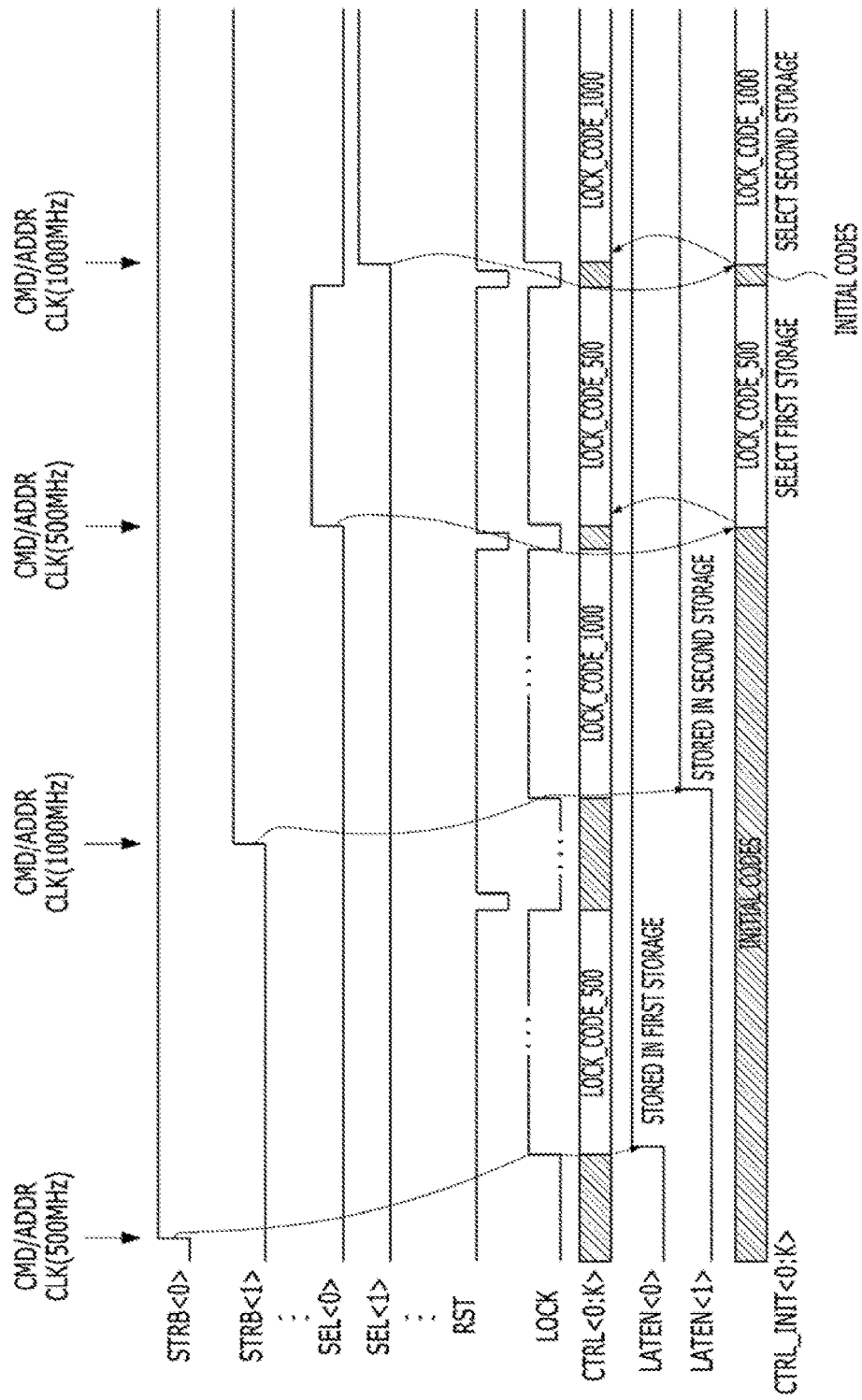
FIG. 6 is a timing diagram illustrating an operation of the semiconductor system in accordance with an embodiment of the present invention.

FIG. 6 is a timing diagram illustrating an operation of the semiconductor system in accordance with an embodiment of the present invention.

Referring to FIG. 6, the controller 200 may output the external clock signal EXT_CLK and the command/address signal CMD/ADDR to the semiconductor device 100. Herein, it is assumed that the command/address signal CMD/ADDR includes information representing that the frequency of the external clock signal EXT_CLK is approximately 500 MHz.

The internal clock generation unit 150 of the semiconductor device 100 may perform a locking operation of delaying the external clock signal EXT_CLK by a predetermined time to output the internal clock signal INT_CLK, and output the locking signal LOCK and the delay control signal CTRL<0:K> when the locking operation is finished. Herein the code value of the delay control signal CTRL<0:K> may include frequency information of approximately 500 MHz. After the locking operation is finished, the locking signal LOCK and the delay control signal CTRL<0:K> may be initialized based on the reset signal RST.

Meanwhile, the decoding unit 110 may decode the command/address signal CMD/ADDR provided by the controller 200 and generate the input control signal STRB<0:M>. Herein, since there is no pre-stored delay control signal CTRL<0:K>, the output control signal SEL<0:N> may be disabled.

The control signal generator 310 of the initial value setting unit 130 may generate the latch control signal LATEN<0:M> corresponding to each bit of the input control signal STRB<0:M> whenever the locking signal LOCK is enabled. In other words, while the first bit STRB<0> of the input control signal STRB<0:M> is enabled, the first bit LATEN<0> of the latch control signal LATEN<0:M> may be enabled when the locking signal LOCK is enabled. The preceding value storage 330 may store the delay control signal CTRL<0:K> outputted from the internal clock generation unit 150 in a first storage 330_0 in response to the first bit LATEN<0> of the latch control signal LATEN<0:M>. Therefore, the first storage 330_0 may store the code value "LOCK_CODE_500" of the delay control signal CTRL<0:K> for the frequency of approximately 500 MHz.

When the controller 200 changes the frequency of the external clock signal EXT_CLK, the controller 200 may output the external clock signal EXT_CLK and the command/address signal CMD/ADDR back to the semiconductor device 100. Herein, it is assumed that the command/address signal CMD/ADDR includes information representing that the frequency of the external clock signal EXT_CLK is approximately 1000 MHz.

Likewise, the internal clock generation unit 150 may output the locking signal LOCK and the delay control signal CTRL<0:K> when the locking operation is completed. Herein, the code value of the delay control signal CTRL<0:K> may include frequency information for approximately 1000 MHz.

The decoding unit 110 may decode the command/address signal CMD/ADDR provided by the controller 200 and generate the input control signal STRB<0:M>. Herein, since there is no pre-stored delay control signal CTRL<0:K> for approximately 1000 MHz, the output control signal SEL<0:N> may be disabled.

While the second bit STRB<1> of the input control signal STRB<0:M> is enabled, the initial value setting unit 130 may enable the second bit LATEN<1> of the latch control signal LATEN<0:M> when the locking signal LOCK is enabled. In response to the second bit LATEN<1> of the latch control signal LATEN<0:M> the initial value setting unit 130 may store the delay control signal CTRL<0:K> outputted from the internal clock generation unit 150 in a second storage 330_1. Therefore, the second storage 330_1 may store the code value "LOCK_CODE_1000" of the delay control signal CTRL<0:K> for the frequency of approximately 1000 MHz.

Through the method described above, the delay control signal CTRL<0:K> that is outputted whenever the locking operation is finished may be sequentially stored in the storages 330_0 to 330_M. When the external clock signal EXT_CLK having the frequency of approximately 1000 MHz is inputted, the controller 200 may disable the input control signal STRB<0:M> so that the delay control signal CTRL<0:K> which is outputted when the corresponding locking operation is finished is not stored in the storages 330_0 to 330_M.

Subsequently, when the controller 200 changes the frequency of the external clock signal EXT_CLK, the controller 200 may output the external clock signal EXT_CLK and the command/address signal CMD/ADDR to the semiconductor device 100. Herein, it is assumed that the command/address signal CMD/ADDR includes information representing that the frequency of the external clock signal EXT_CLK is approximately 500 MHz.

In this case, since the code value of the delay control signal CTRL<0:K> for approximately 500 MHz is already stored in the first storage 330_0, the decoding unit 110 may generate the output control signal SEL<0:N> for selecting the first storage 330_0 based on the command/address signal CMD/ADDR. The initial value outputter 350 of the initial value setting unit 130 may output the code value stored in the first storage 330_0 as the initial value control signal CTRL_INIT<0:K> in response to the output control signal SEL<0:N>.

The internal clock generation unit 150 may generate the delay control signal CTRL<0:K> having an initial value "LOCK_CODE_500" that is set based on the initial value control signal CTRL_INIT<0:K>, and perform a locking operation of generating the internal clock signal INT_CLK by delaying the external clock signal EXT_CLK based on the delay control signal CTRL<0:K>.

Subsequently, when the controller 200 changes the frequency of the external clock signal EXT_CLK again, the controller 200 may output the external clock signal EXT_CLK and the command/address signal CMD/ADDR to the semiconductor device 100. Herein, it is assumed that the command/address signal CMD/ADDR includes information representing that the frequency of the external clock signal EXT_CLK is approximately 1000 MHz.

Likewise, since the code value of the delay control signal CTRL<0:K> for approximately 1000 MHz is already stored in the second storage 330_1 the decoding unit 110 may generate the output control signal SEL<0:N> for selecting the second storage 330_1 based on the command/address signal CMD/ADDR. The initial value outputter 350 of the initial value setting unit 130 may output the code value stored in the second storage 330_1 as the initial value control signal CTRL_INIT<0:K> in response to the output control signal SEL<0:N>.

The internal clock generation unit 150 may generate the delay control signal CTRL<0:K> having an initial value "LOCK_CODE_1000" that is set based on the initial value control signal CTRL_INIT<0:K>, and perform a locking operation of generating the internal clock signal INT_CLK by delaying the external clock signal EXT_CLK based on the delay control signal CTRL<0:K>.

As described, in the embodiment of the present invention, when the code values of the delay control signal CTRL<0:K> for each frequency of the external clock signal EXT_CLK are stored, the delay control signal CTRL<0:K> of a desired frequency may be selectively stored by using the input control signal STRB<0:M>, Further, a code value corresponding to a frequency of a current external clock EXT_CLK may be set as the initial value of the delay control signal CTRL<0:K> from the pre-stored code values of the delay control signal CTRL<0:K> by using the output control signal SEL<0:N>. Therefore, the locking time of the internal clock generation unit, i.e., the delay locked loop, maybe decreased by setting the code value corresponding to the frequency of the current external clock EXT_CLK as the initial value of the delay control signal CTRL<0:K> based on the command/address signal CMD/ADDR provided by the controller 200. Also, a memory system employing the technology of the present invention exhibits enhanced stability because of an increased operation timing margin.

Hereafter, a semiconductor system in accordance with another embodiment of the present invention is described with reference to the accompanying drawings.

Figure 7:
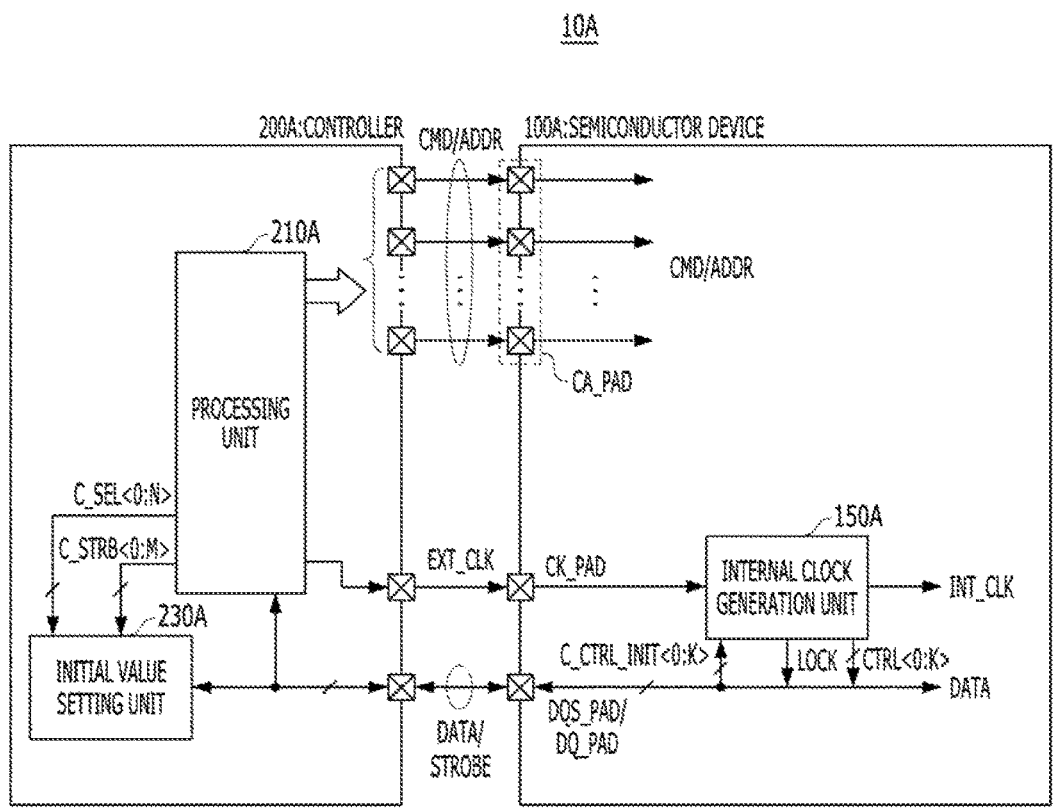
FIG. 7 is a block diagram illustrating a semiconductor system in accordance with an embodiment of the present invention.

FIG. 7 is a block diagram illustrating a semiconductor system 10A in accordance with another embodiment of the present invention.

Referring to FIG. 7, the semiconductor system 10A may include a semiconductor device 100A and a controller 200A.

The semiconductor system 10A of FIG. 7 may be different from the semiconductor system 10 shown in FIG. 1 in that the controller 200A includes an initial value setting unit 230A, and the controller 200A receives a locking signal LOCK and a delay control signal CTRL<0:K> from the semiconductor device 100A and outputs an initial value control signal C_CTRL_INIT<0:K> to the semiconductor device 100A, through existing data pad DQ_PAD data strobe pad DQS_PAD, and a transmission line.

To be specific, the semiconductor device 100A may include an internal clock generation unit 150A. Since the internal clock generation unit 150A of FIG. 7 has substantially the same structure as the internal clock generation unit 150 of FIG. 1, further description on it is omitted herein.

The controller 200A may include a processing unit 210A and an initial value setting unit 230A.

The processing unit 210A may generate an input control signal C_STRB<0:M> and an output control signal C_SEL<0:N>.

The initial value setting unit 230A may include a plurality of storages (not shown) respectively corresponding to bits of the input control signal C_STRB<0:M>, and receive the locking signal LOCK and the delay control signal CTRL<0:K> from the internal clock generation unit 150A. Whenever the locking signal LOCK is enabled, the initial value setting unit 230A may sequentially store the code values of the delay control signal CTRL<0:K> in the storages in response to the input control signal C_STRB<0:M>, and select one of the pre-stored code values to output the initial value control signal C_CTRL_INIT<0:K> to the internal clock generation unit 150A, based on the output control signal C_SEL<0:N>, Since the initial value setting unit 230A of FIG. 7 has substantially the same structure as the initial value setting unit 230 of FIG. 1, further description on it is omitted herein.

Including the initial value setting unit 230A inside the controller 200A, it may be advantageous in a system where a plurality of semiconductor devices are coupled to one controller in that the load on the semiconductor devices may be reduced and the controller may more readily control the semiconductor devices collectively. When the semiconductor device 100A is a semiconductor memory device, particularly, when the semiconductor device 100A is a Dynamic Random Access Memory (DRAM) device, the controller 200A may perform training between a data strobe signal DQS and an internal clock signal INT_CLK by varying the delay control signal CTRL<0:K> using the initial value control signal C_CTRL_INIT<0:K>.

Figure 8:
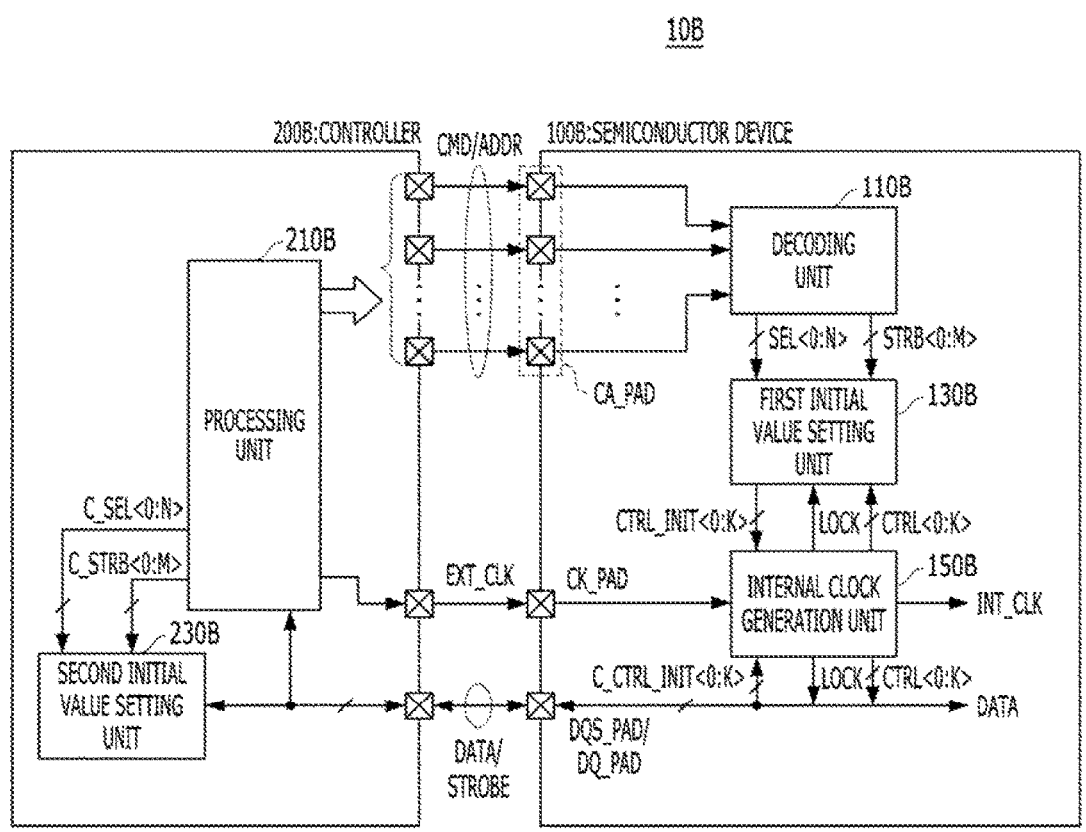
FIG. 8 is a block diagram illustrating a semiconductor system in accordance with an embodiment of the present invention.

FIG. 8 is a block diagram illustrating a semiconductor system 10B in accordance with yet another embodiment of the present invention.

Referring to FIG. 8, the semiconductor system 10B may include a semiconductor device 100B and a controller 200B.

In the semiconductor system 10B of FIG. 8, the semiconductor device 100B and the controller 200B may all include an initial value setting unit. In other words, the semiconductor system 10B of FIG. 8 has a configuration that is a hybrid between the configurations of the semiconductor systems 10 and 10A of FIGS. 1 and 7. In the semiconductor system 10B a first initial value setting unit 130B included in the semiconductor device 100B or a second initial value setting unit 230B included in the controller 200B may be selectively used.

To be specific, the semiconductor device 100B may include a decoding unit 110B, the first initial value setting unit 130B, and an internal clock generation unit 150B. Since the semiconductor device 100B of FIG. 8 has substantially the same structure as the semiconductor device 100 of FIG. 1, further description on it is omitted herein.

The controller 200B may include a processing unit 210B and the second initial value setting unit 230B. Since the controller 200B of FIG. 8 has substantially the same structure as the controller 200A of FIG. 7, further description on it is omitted herein.

As both of the semiconductor device 100B and the controller 200B include the initial value setting unit, a first initial value control signal CTRL_INIT<0:K> outputted from the first initial value setting unit 130B of the semiconductor device 100B or a second initial value control signal CTRL_INIT<0:K> outputted from the second initial value setting unit 230B of the controller 200B may be selectively used according to the situations.

According to an embodiment of the present invention, a semiconductor device may pre-store a code value corresponding to a frequency of a current external clock as an initial value of a delay control signal. As a result, an operation speed of a delay locked loop may be increased and a locking time of the delay locked loop may be decreased.

Also, the semiconductor device according to an embodiment of the present invention may increase an operation timing margin by setting an optimal value of the delay control signal within a short time, thus securing stability of a system including the semiconductor device.

While the present invention has been described with respect to specific embodiments it will be apparent to those skilled in the art that various changes and modifications may be made without departing from the spirit and scope of the invention as defined in the following claims.

For example, the logic gates and transistors illustrated in the above-described embodiments of the present invention may be realized in different positions and different kinds according to the polarity of an input signal.

What is claimed is:

1. A semiconductor system comprising:
  a controller configured to output an external clock signal and a command/address signal; and
  a semiconductor device including:
    a decoding unit configured to decode the command/address signal and generate an input control signal and an output control signal,
    an initial value setting unit configured to sequentially store code values of a delay control signal in response to the input control signal when a locking signal is enabled, and select one of pre-stored code values of the delay control signal to output an initial value control signal in response to the output control signal, and
    an internal clock generation unit configured to generate the delay control signal having an initial value that is set based on the initial value control signal, perform a locking operation of generating an internal clock signal by delaying the external clock signal by a predetermined time based on the delay control signal, and output the locking signal and the delay control signal when the locking operation is finished.

2. The semiconductor system of claim 1, wherein the semiconductor device includes:
  a delay locked loop (DLL) configured to delay the external clock signal by the predetermined time based on the delay control signal to output the internal clock signal.

3. The semiconductor system of claim 1, wherein the controller generates the command/address signal that includes frequency information on the external clock signal.

4. The semiconductor system of claim 1, wherein the initial value setting unit includes:
  a control signal generator configured to generate a latch control signal based on the input control signal when the locking signal is enabled;
  a preceding value storage including the plurality of the storages, and configured to sequentially store the delay control signal in the storages in response to each bit of the latch control signal; and
  an initial value outputter configured to select one output of the storages to output the initial value control signal in response to the output control signal.

5. The semiconductor system of claim 4, wherein control signal generator includes a plurality of flip-flops serially coupled to each other, configured to receive the locking signal through a clock terminal, and the bits of the input control signal through a reset terminal, wherein an input terminal of a foremost flip-flop is coupled to a power source voltage terminal, and each bit of the latch control signal is outputted through an output terminal of each of the plurality of the flip-flops.

6. The semiconductor system of claim 1, wherein the internal clock generation unit includes:
  a delay line configured to generate the internal clock signal by delaying the external clock signal in response to the delay control signal;
  a delay compensator configured to generate a feedback clock signal by delaying the internal clock signal by a predetermined time;
  a phase detector configured to generate a phase detection signal by comparing a phase of the external clock signal with a phase of the feedback clock signal; and
  a delay controller configured to generate the delay control signal based on the phase detection signal, wherein the delay control signal is generated to have the initial value that is set based on the initial value control signal, and output the locking signal and the delay control signal when the locking operation is finished.

7. The semiconductor system of claim 1, wherein the internal clock generation unit is a digital delay locked loop.

8. A semiconductor device comprising:
  a decoding unit configured to decode a command/address signal and generate an input control signal and an output control signal;
  an initial value setting unit including a plurality of storages corresponding to bits of the input control signal, and configured to sequentially store code values of a delay control signal in the storages in response to the input control signal when a locking signal is enabled, and select one of the stored code values to output an initial value control signal based on the output control signal; and
  a delay locked loop (DLL) configured to generate the delay control signal having an initial value that is set based on the initial value control signal, perform a locking operation of generating an internal clock signal by delaying an external clock signal based on the delay control signal, and output the locking signal and the delay control signal when the locking operation is finished.

9. The semiconductor device of claim 8, wherein the command/address signal includes frequency information on the external clock signal.

10. The semiconductor device of claim 8, wherein the initial value setting unit includes:
  a control signal generator configured to generate a latch control signal based on the input control signal when the locking signal is enabled;
  a preceding value storage including the plurality of the storages, and configured to sequentially store the delay control signal in the storages in response to each bit of the latch control signal; and
  an initial value outputter configured to select one output of the storages to output the initial value control signal in response to the output control signal.

11. The semiconductor device of claim 10, wherein the control signal generator includes
  a plurality of flip-flops serially coupled to each other, configured to receive the locking signal through a clock terminal, and the bits of the input control signal through a reset terminal, wherein an input terminal of a foremost flip-flop is coupled to a power source voltage terminal, and each bit of the latch control signal is outputted through an output terminal of each of the plurality of the flip-flops.

12. The semiconductor device of claim 8, wherein the delay locked loop includes:
a delay line configured to generate the internal clock signal by delaying the external clock signal in response to the delay control signal;
a delay compensator configured to generate a feedback clock signal by delaying the internal clock signal by a predetermined time;
a phase detector configured to generate a phase detection signal by comparing a phase of the external clock signal with a phase of the feedback clock signal; and
a delay controller configured to generate the delay control signal based on the phase detection signal, wherein the delay control signal is generated to have the initial value that is set based on the initial value control signal, and output the locking signal and the delay control signal when the locking operation is finished.

13. A semiconductor system comprising:
a controller configured to output an external clock signal, and an initial value control signal; and
a semiconductor device configured to generate a delay control signal having an initial value that is set based on the initial value control signal, and output an internal clock signal by delaying the external clock signal by a predetermined time based on the delay control signal,
wherein the controller includes:
a processing unit configured to generate an input control signal and an output control signal based on frequency information of the external clock signal; and
an initial value setting unit including a plurality of storages corresponding to bits of the input control signal, and configured to receive a locking signal and the delay control signal from the semiconductor device, sequentially store code values of the delay control signal in the storages in response to the input control signal when the locking signal is enabled, and select one of the pre-stored code values to output the initial value control signal based on the output control signal.

14. The semiconductor system of claim 13, wherein the initial value setting unit includes:
a control signal generator configured to generate a latch control signal based on the input control signal when the locking signal is enabled;
a preceding value storage including the plurality of the storages, and configured to sequentially store the delay control signal in the storages in response to each bit of the latch control signal; and
an initial value outputter configured to select one output of the storages to output the initial value control signal in response to the output control signal.

15. The semiconductor system of claim 13, wherein the semiconductor device includes a digital delay locked loop.

* * * * *